(12) United States Patent
Corsi et al.

(10) Patent No.: US 11,884,538 B2
(45) Date of Patent: Jan. 30, 2024

(54) ROOT MEAN SQUARE SENSOR DEVICE

(71) Applicant: TEXAS INSTRUMENTS INCORPORATED, Dallas, TX (US)

(72) Inventors: Marco Corsi, Scotts Valley, CA (US); Barry Jon Male, West Granby, CT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/487,203

(22) Filed: Sep. 28, 2021

(65) Prior Publication Data

US 2022/0009767 A1    Jan. 13, 2022

Related U.S. Application Data

(63) Continuation of application No. 16/699,332, filed on Nov. 29, 2019, now Pat. No. 11,155,460.

(51) Int. Cl.
*B81B 7/02* (2006.01)
*B81B 7/00* (2006.01)
*B81C 1/00* (2006.01)

(52) U.S. Cl.
CPC .............. *B81B 7/008* (2013.01); *B81B 7/007* (2013.01); *B81B 7/02* (2013.01); *B81C 1/00238* (2013.01); *B81B 2201/0278* (2013.01)

(58) Field of Classification Search
None
See application file for complete search history.

(56) References Cited

U.S. PATENT DOCUMENTS

| | | | |
|---|---|---|---|
| 6,460,411 B1 * | 10/2002 | Kersjes | ................ G01F 1/7084 73/204.26 |
| 10,578,572 B2 | 3/2020 | Liu et al. | |
| 2018/0057354 A1 | 3/2018 | Hu et al. | |
| 2019/0331514 A1 | 10/2019 | De Luca et al. | |

* cited by examiner

*Primary Examiner* — Benjamin P Sandvik
(74) *Attorney, Agent, or Firm* — John R. Pessetto; Frank D. Cimino

(57) ABSTRACT

A sensor device includes a first and second Micro-Electro-Mechanical (MEM) structures. The first MEM structure includes a first heating element on a first layer of the first MEM structure. The first heating element includes an input adapted to receive an input signal. The first MEM structure also includes a first temperature sensing element on a second layer of the first MEM structure. The second MEM structure includes a second heating element on a first layer of the second MEM structure and a second temperature sensing element on a second layer of the second MEM structure. An output circuit has a first input coupled to the first temperature sensing element and a second input coupled to the second temperature sensing element.

16 Claims, 11 Drawing Sheets

ROOT MEAN SQUARE SENSOR DEVICE

CROSS-REFERENCE TO RELATED APPLICATION(S)

This continuation application claims priority to U.S. patent application Ser. No. 16/699,332, filed Nov. 29, 2019, which application is incorporated herein by reference in its entirety.

TECHNICAL FIELD

This disclosure relates to a root mean square sensor device.

BACKGROUND

The root mean square (RMS) value of an alternating current (AC) is also known as its heating value, as it is a voltage which is equivalent to the direct current (DC) value that would be required to get the same heating effect. A thermal converter is a device that includes a heating element and temperature sensing element configured to convert an AC input signal into a corresponding RMS value. For example, an AC signal is applied to a heating element that is matched with a thermistor (or other temperature sensing element) that is used in a DC measuring circuit to provide an output representative of the DC value.

SUMMARY

One example includes a sensor device that includes a first Micro-Electro-Mechanical (MEM) structure and a second MEM structure. The first MEM structure includes a first heating element on a first layer of the first MEM structure. The first heating element includes an input adapted to receive an input signal. The first MEM structure also includes a first temperature sensing element on a second layer of the first MEM structure, the first layer being separated from the second layer by at least one insulating layer. The second MEM structure includes a second heating element on a first layer of the second MEM structure and a second temperature sensing element on a second layer of the second MEM structure. The first layer of the second MEM structure being separated from the second layer of the second MEM structure by at least one insulating layer. An output circuit has a first input coupled to the first temperature sensing element and a second input coupled to the second temperature sensing element.

Another example includes a sensor circuit package that includes at least two Micro-Electro-Mechanical (MEM) structures. Each of the MEM structures includes a central core region including a thermal converter circuit that is configured to heat the core region in response to a signal at an input thereof and to provide a temperature signal representing a temperature of the heated central core region. A support structure is coupled between the central core region and surrounding substrate. The support structure is configured to support the central core region to be thermally and mechanically isolated with respect to the surrounding substrate. An amplifier circuit is configured to provide an amplifier signal at an output of the amplifier based on the output signals provided by the thermal converters of the respective MEM structures.

DETAILED DESCRIPTION

Figure 1:
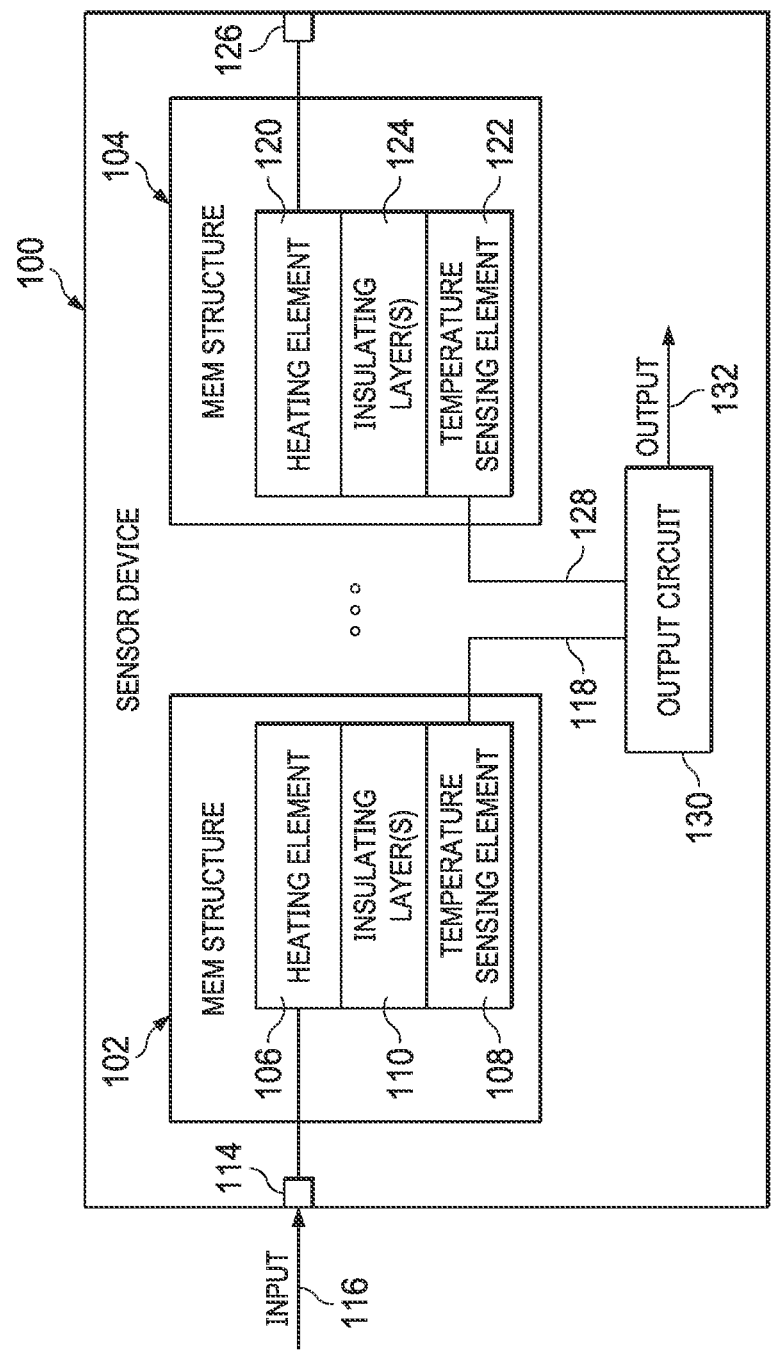
FIG. 1 is a block diagram depicting an example of a sensor device.

The disclosure relates a sensor device and system that includes a true root mean square (RMS) thermal converter configured to generate an RMS representation based on one or more input signals. The RMS thermal converter can be fully integrated in a low-cost injection molded plastic package to provide a high performance sensor device. Numerous sensor and circuit topologies exist that can be utilized in various configurations. The sensor device offers high linearity and precision and can also provide full galvanic isolation between input and output. In some examples, the sensor device can be packaged in a low-cost injection molded plastic package. The sensor device thus may to maintain thermal isolation and exhibit performance that is independent of mechanical stress induced in the silicon via the plastic package and printed circuited board (PCB) on which the package is mounted. The sensor device also can reduce stress induced from environmental conditions (e.g., humidity variations). This performance is achieved through use of a microfabrication process that embeds a hermetic, micro-electro-mechanical (MEM) thermal converter structure that is isolated from the plastic package in which it is encapsulated.

As an example, a sensor device includes at least two MEM structures, each having a core region that includes a thermal converter circuit configured to provide an output signal that is an RMS value of an input signal received at an input. The MEM structures may be fabricated on a common substrate (e.g., monolithic silicon), which enables the MEM structures to be constructed as matching structures. The thermal converter circuit of a MEM structure includes a heating element on a first layer and a temperature sensing element on a second layer that is spaced apart from the first layer by at least one insulating layer (e.g., an oxide or other dielectric layer) that provides galvanic isolation between the input and the output of the thermal converter. For example, the heating element is a resistive element that is coupled to one or more inputs through respective interconnects. An input thus can be adapted to receive an input signal from associated circuitry, such as may be integrated on a PCB or otherwise connected to the input. The temperature sensing element (e.g., a diode, thermistor, bipolar transistor, MOSFET or thermocouple) is configured to provide a temperature signal representing the temperature of the heated core region in response to application of signal to the heating element. For example, the temperature signal from the heating element represents a true RMS value of the input signal.

As a further example, the sensor device includes at least two such MEM structures that are fabricated on a substrate (e.g., bulk silicone) as matched structures (e.g., fabricated on a common substrate according to a common fabrication process). An output circuit is coupled to the temperature sensing element of each MEM structure of the sensing device. For example, the output circuit includes an amplifier having inputs coupled to receive the temperature signals from the respective temperature sensing elements. In one example, the amplifier has an output coupled to a heating element of one of the MEM structures and is configured to drive such heating element in a closed loop manner to match the heating of the first heating element based on the temperature signals produced by the respective temperature sensing elements of each MEM structure. In such closed loop circuit topology, the transfer function linearity of the sensor can be increased relative to existing thermal converters.

In another example, the sensor device may be configured in an open loop circuit topology. For example, the input of a first heating element is adapted to receive a first input signal. A second heating element of another MEM structure has another input that is adapted to receive a second input signal. The inputs of the amplifier are coupled to receive temperature signals from temperature sensing elements of each of the MEM structures. The amplifier is thus configured to provide an output signal representing a difference between the RMS values of the first and second input signals that are applied to the respective heating elements of the MEM structures.

As disclosed herein, each thermal converter is configured thus to provide an output signal equivalent to the "heating value" or RMS value of the applied input signal, regardless of that signals waveform. Advantageously, the MEM structure includes galvanic isolation between input and output and further can operate from DC to high frequencies, such as GHz or higher. The MEM structure further affords isolation from mechanical stress due to packaging and thermal isolation. Moreover, due to the small size of the heating element on the MEM structure, the input impedance of the converter can be such that it does not significant load the signal being measured.

FIG. 1 depicts an example of a sensor device 100. The sensor device 100 includes two or more MEM structures 102 and 104. There can be any number of each of the respective MEM structures 102 and 104 in a variety of configurations as indicated by the ellipsis between the respective structures illustrated in FIG. 1. In one example, the MEM structures 102 and 104 are implemented on the common base layer of the substrate material (e.g., bulk silicon substrate) in a single die. In another example, each of the MEM structures may be implemented in separate die that may be integrated into a common sensor package (e.g., a multi-chip sensor package).

Each of the MEM structures 102 and 104 may be produced by the same fabrication process and under the same process parameters. For example, the MEM structures 102 and 104 can be fabricated at the same time or sequentially according to a microfabrication process. Thus, the MEM structures 102 and 104 are matched to be substantially identical (or proportional) devices and thus operate in a substantially identical manner. As used herein, the term substantially in this context is to denote that the construction and/or operation of the MEM structures 102 and 104 are intended to be identical, but may differ slightly from the intended relationship within variations due to the fabrication process and the materials that are used. In the following examples, unless indicated otherwise, the MEM structures are considered to be substantially identical.

Each of the MEM structures 102 and 104 includes a thermal converter configured to implement a true RMS converter. For example, the MEM structure 102 includes as heating element 106 that is implemented on a layer of the MEM structure that is separated from a temperature sensing element 108 that is implemented on another layer. One or more insulating (dielectric) layers 110 separate the heating element 106 from the temperature sensing element 108. For example, the insulating layer is an oxide layer is formed of an inter-metal dielectric that provides galvanic isolation between the heating element 106 and the temperature sensing element 108.

The heating element 106 is coupled to a terminal 114 of the device that is adapted to receive an input signal 116 from another circuit or device (not shown). As an example, in response to the input signal 116 that is applied to the terminal 114, electrical current flows through the heating element to heat a region of the MEM structure 102. The temperature sensing element 108 is arranged in the region and thus senses the rise in temperature and provides a corresponding output signal representative of such heating. The output signal (in response to the heating) represents an RMS value of the input signal at 114. The temperature sensing element 108 provides the output signal at an output 118 thereof that is coupled to an input of an output circuit 130.

As mentioned, the other MEM structure 104 is configured the same as MEM structure 102 and thus includes a heating element 120, a temperature sensing element 122 and one or more insulating layers 124. The heating element 120 is coupled to a terminal 126 of the sensor device and a temperature sensing element has an output 128 that is coupled to another input of the output circuit 130. As with MEM structure 102, the MEM structure 104 is configured as a thermal converter, such that a heating element 120 heats a region of the MEM structure 104 and such heating is detected by the temperature sensing element 122. The temperature sensing element 122 thus provides an output signal at 128 based on the heating and thus representative of an RMS value of the signal provided at the terminal 126.

The output circuit 130 is coupled to receive the output signals provided at 118 and 128 from the temperature sensing elements 108 and 122 at respective inputs. The output circuit 130 is configured to generate an output signal at 132 based on the temperature signals at 118 and 128. As disclosed herein, the output 132 of the output circuit 130 can be utilized for a variety of different purposes according to sensing requirements and application specifics in which the sensor device 100 is used.

In one example, the output 132 can be coupled to the terminal 126 to drive the heating element 120 with feedback based on the signals provided at 118 and 128. In this closed loop example, the output circuit 130 is configured to drive the heating element 120 until the temperature of the heated regions in each of the MEM structures 102 and 104 are equal. In this example, the output signal at 132 represents the RMS value of the input signal 116 that is applied to the input terminal 114. In another example, another input signal may be applied to the terminal 126. In this open loop example, the output circuit 130 provides the output 132 to represent a difference between the RMS values of the signals applied at terminals 114 and 126.

As disclosed herein, the heated regions of the MEM structures 102 and 104, which contain heating element, insulating layer(s) and temperature sensing element, can correspond to a central core that is mechanically and thermally isolated from surrounding substrate material of the die in which the MEM structures 102 and 104 reside. For example, the core region can be surrounded by a vacuum or a volume of inert gas to reduce thermal loss from the core region. Additionally, each of the MEM structures may include a support structure, such as an arrangement of support arms, connected between the surrounding substrate and the respective core regions such that the core regions are floating within the semiconductor die. The support structure (mechanically) isolates the central core region from packing stress that may be applied to the surrounding substrate. Additionally, to enhance thermal isolation of the core region, the core region (on which the thermal converter circuitry resides) can be sandwiched between a cap and base layer of the die. For example, the cap and base layer thus may be applied to enclose and hermetically seal each core region within the die surrounded by a vacuum or region of inert gas. In the example MEM structure implementing the floating core region, a dominant conductive thermal loss path is through the support arms. This thermal loss can be managed by design of the support arm structure. For example, the thermal loss can be controlled by setting the length and cross-sectional area of each arm as well as arranging the arms symmetrically along a perimeter of the core region.

Figure 2:
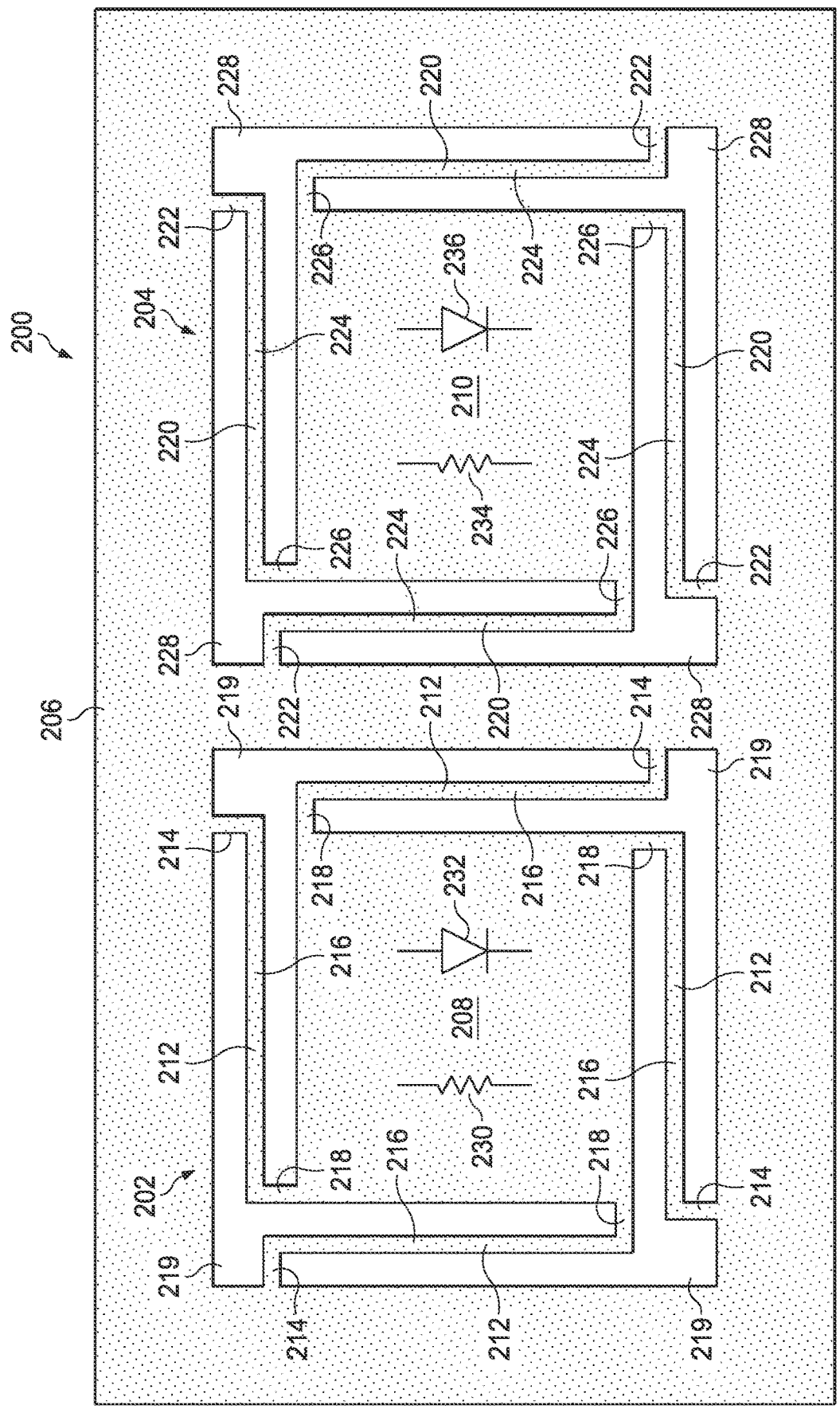
FIG. 2 depicts example of MEM structures that can be used to implement a sensor device.

FIG. 2 depicts an example of a sensor device 200 that includes a pair of MEM structures 202 and 204 (e.g., corresponding to MEM structures 102 and 104). The sensor device 200 is fabricated on a substrate material 206, such as a bulk silicon substrate. Each MEM structure 202 and 204 includes a respective central core region 208 and 210 that is supported to be floating with respect to the surrounding substrate 206. As disclosed herein, the central core regions 208 and 210 are thermally and mechanically isolated from the surrounding substrate by a vacuum region or hollow region containing an inert gas. For example, a gap between the outer surfaces of each central core region 208, 210 and adjacent substrate may be formed by etching or otherwise cutting away respective layers of the die structure leaving only a supporting structure to support the central core region in the device 200.

By way of example, the MEM structure 202 includes an arrangement of support arms 212 configured to hold the floating central core with respect to the surrounding substrate 206. For example, each support arm 212 is a generally T-shaped structure that includes a base portion 214, a central arm portion 216 and a support portion 218. The base portion is connected to and extends from the surrounding substrate 206. The central arm portion 216 extends orthogonally from the base portion and parallel to an adjacent perimeter portion of the central core 208. The support portion 218 extends from an opposite end of the arm portion 216 and is connected near a corner of the central core 208. In one example, four support arms 212 are arranged symmetrically along respective side edges of central core 208 and are connected at respective corners to support the central core with respect to the surrounding substrate 206. Other numbers and configurations of support structures may be used in other examples.

The support arms 212 may be formed of the same material as one of the layers of the core, such as may be grown or deposited over a top layer thereof and etched or otherwise cut to form the arm structures. In an example, the silicon substrate (e.g., wafer) may be patterned by a photoresist. The photoresist protects the core, surrounding silicon and arms from etching allowing L-shaped voids 219 to form around and thereby create the supporting arms 212. In this way, the support arms 212 are configured to support the central core region 208 with respect to the surrounding substrate 206 to provide thermal and mechanical isolation of the core region relative to the substrate. The other MEM structure 204 may be a replica of the MEM structure 202 and be formed concurrently with the MEM structure (e.g., through a process that includes applying photoresist and etching to form voids in the substrate 206 to define respective arms 220). Briefly stated, the central core region 210 is supported with respect to the surrounding substrate 206 by an arrangement of support arms 220. For example, each support arm 220 includes a base portion 222 connected to a surface of the substrate 206, an elongated arm portion 224 that extends from the base portion and a support portion 226 that extends from the arm portion and is connected to a corner of the central core 210.

As disclosed herein, each central region 208 and 210 includes a thermal converter circuit configured to provide an output signal representing an RMS value of an input signal based on heating of the respective central core region. For example, FIG. 2 schematically illustrates the thermal converter circuit of MEM structure 202 as including a heating element, demonstrated as a resistor 230, and a temperature sensing element, demonstrated as a diode 232. Likewise the thermal converter circuit of the MEM structure 204 includes a heating element, demonstrated as a resistor 234, and a temperature sensing element, demonstrated as a diode 236. In each MEM structure 202 and 204, the respective resistor and diode can be formed on separate layers of the central core region 210 such as disclosed herein. While the temperature sensing devices are demonstrated as a diode in FIG. 2, in other examples, the temperature sensing devices may be implemented by other temperature dependent devices, such as thermistors, bipolar transistors, MOSFETs or thermocouples.

Because the thermal converter circuit implemented on the central core region 210 is thermally and mechanically isolated from the surrounding substrate, the sensitivity of the thermal converter can be higher compared to existing thermal converters. Moreover, by including a pair of thermal converter circuits (or more), the sensor device 200 can be constructed and used in a variety of sensing applications such as disclosed herein (see e.g., FIGS. 7-16).

Figure 3:
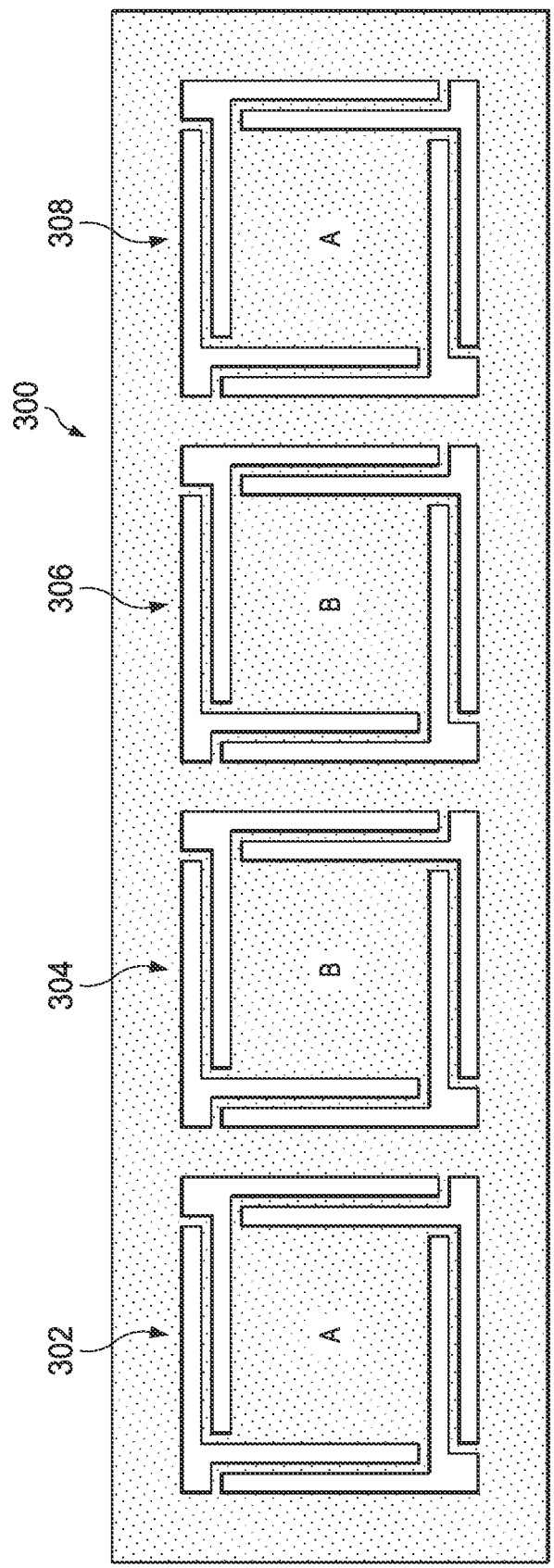
FIG. 3 depicts an example arrangement of MEM structures that may be used to implement a sensor device.
Figure 4:
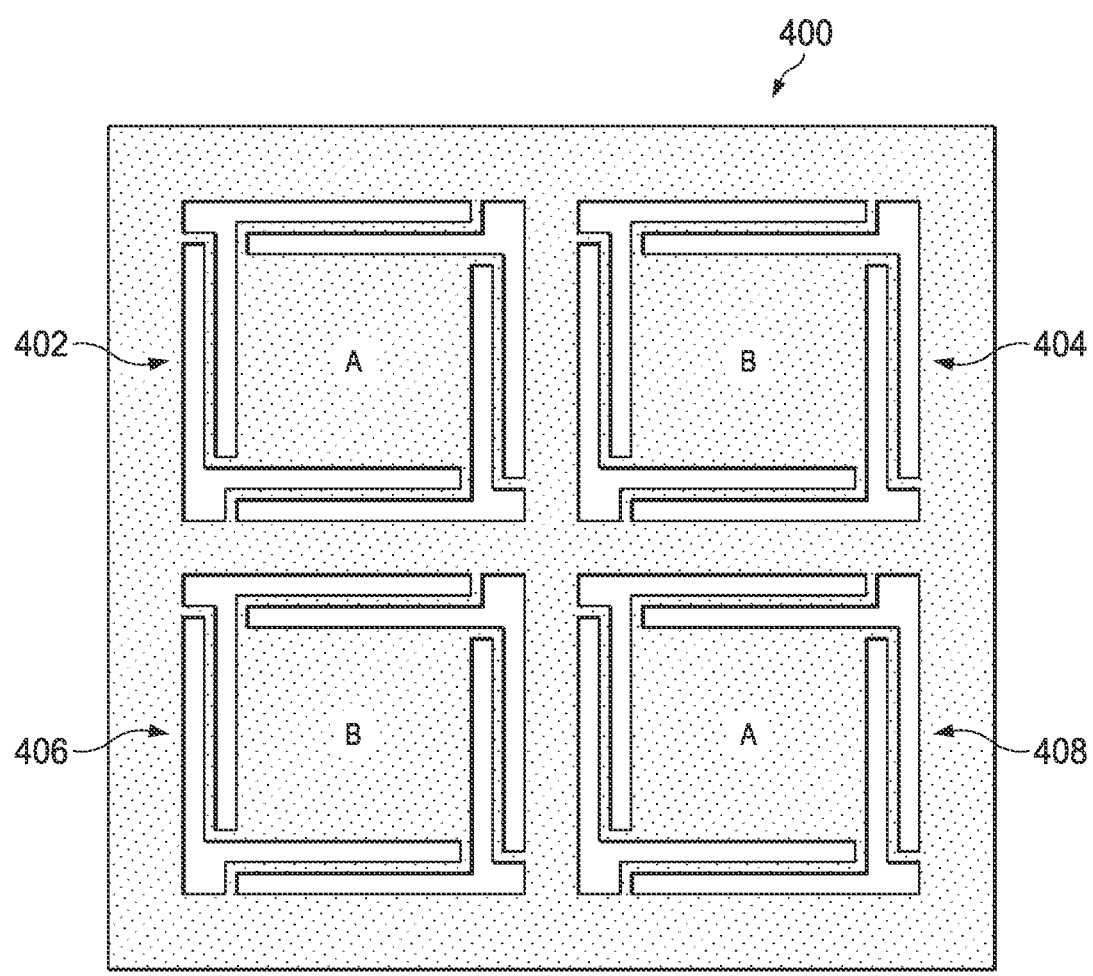
FIG. 4 depicts another example arrangement of MEM structures that can be used to implement a sensor device.

While the example of FIG. 2 demonstrates two MEM structures 202 and 204 implemented for the sensor device 200, different numbers of MEM structures can be implemented in other examples, such as demonstrated in FIGS. 3 and 4. In each of these examples, the respective MEM structures denoted as "A" correspond to an instance of a first MEM structure and respective core regions denoted as "B" correspond to another MEM structure. Each "A" structure is identical and each "B" structure is also identical. In an example, each "A" structure is identical to each "B" structure. In another example, each "A" structure is matched to be proportional (e.g., having a desired ratio) with respect to each "B" structure. The arrangements of "A" and "B" structures, such as demonstrated in FIGS. 3 and 4, facilitates fabrication a device in which the combination of all A devices parametrically match the combination of all B devices. This also helps to improve linearity and reduced effects from externally induced thermal gradients.

In the example of FIG. 3, a sensor device 300 includes MEM structures 302, 304, 306 and 308 arranged as in a linear array of A-B-B-A on a semiconductor substrate. In this arrangement each "B" structure resides adjacent a respective "A" structure on the given semiconductor substrate. In the example of FIG. 4, a sensor device 400 includes MEM structures 402, 404, 406 and 408 arranged as in a two-dimensional array of cross-coupled structures on a semiconductor substrate. As shown in FIGS. 3 and 4, the different "A" and "B" structures may be placed across the die according to application requirements and best practices to achieve desired matching of identical or proportional devices. By utilizing multiple pairs of "A" and "B" structures, various other configurations and layouts may be implemented that exhibit improved linearity and reduced effects from externally induced thermal gradients.

Figure 5:
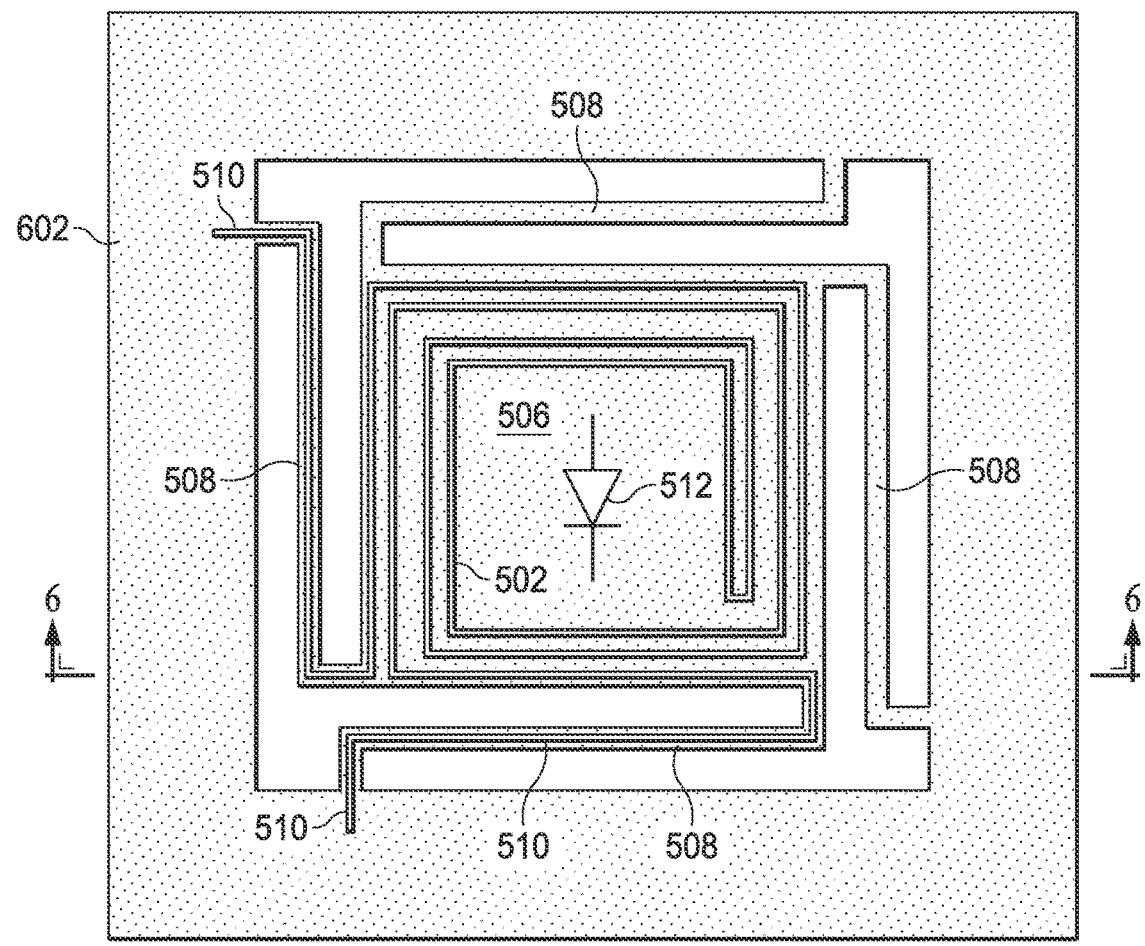
FIG. 5 depicts an example of a MEM structure that includes a resistor and associated interconnects.
Figure 6:
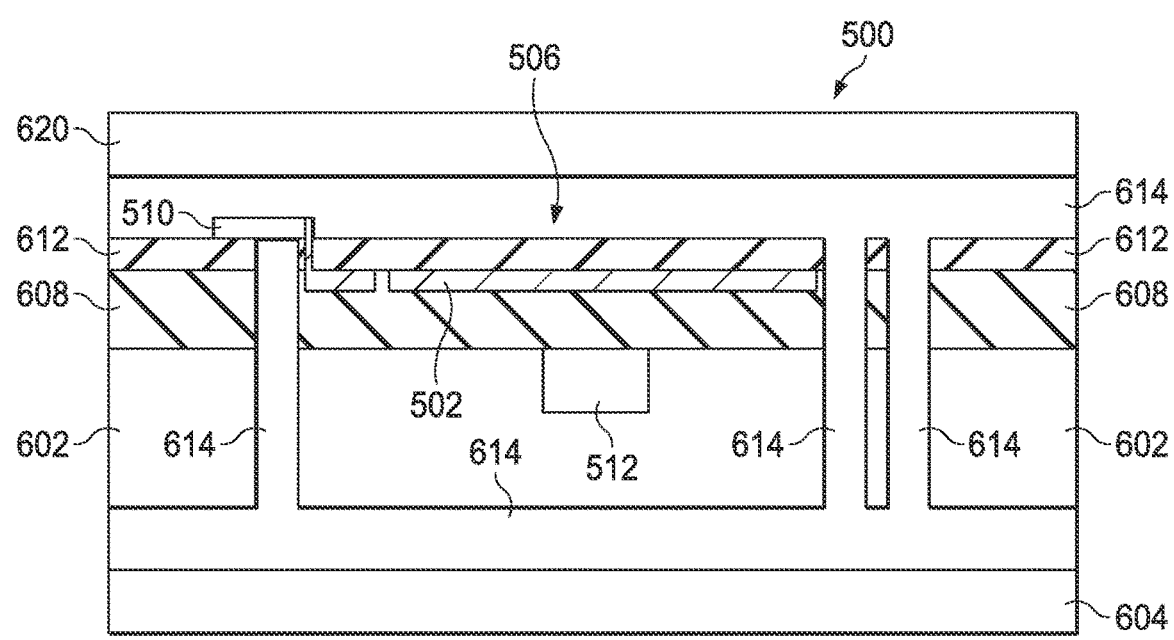
FIG. 6 is a cross-sectional view of a MEM structure taken along the line 6-6 of FIG. 5.

FIGS. 5 and 6 depict an example of a MEM structure 500 to which a heating element 502 has been applied. The MEM structure 500 of FIGS. 5 and 6 can be similar to the MEM structures shown and described with respect to FIGS. 1, 2 and 4. Thus, the heating element of FIG. 5 may be utilized for heating the central core region in each of those examples. FIGS. 5 and 6 use common reference characters to refer to common features in both figures.

In the examples of FIGS. 5 and 6, the heating element 502 includes resistive element disposed on an oxide or other insulating layer of the MEM structure 500. For example, the heating element 502 is a spiral thin film resistor across the surface of an insulating layer 608 (e.g., an oxide layer) of the central core region 506. The thin film resistor may be deposited (e.g., by sputtering) a layer of the electrically conductive material over the insulating layer 608 and then etching a portion of the layer to provide a desired shape (e.g., spiral) resistor across the surface of the central core region 506 spaced inwardly from the support arms 508 (e.g., corresponding to support arms 212) and associated voids. As a further example, the resistive heating element 502 is formed of a metal, such as nickel chromium (NiCr), silicon chromium (SiCr), aluminum or an alloy thereof. Other techniques and materials may be used to form the heating element on the insulating layer. The exposed surface of the resistive heating element may be coated with an insulating material or remain exposed to the vacuum or inert gas in the cavity that surrounds the central core region. In the example of FIG. 5, the temperature sensing element 512 is schematically illustrated as a diode.

The heating element 502 is configured to heat a region of the bulk silicon in the central core region 506 below the heating element in response to a signal applied to the heating element. For example, the ends of the resistive heating element 502 may be connected to terminals (not shown, but see, e.g., terminals 114, 126 as well as others) through corresponding interconnects 510 of electrically conductive material (e.g., a metal). The interconnects 510 can be coupled to the ends of the heating element 502, such as forming them between the support arms 508 and over the passivation layer (layer 612 of FIG. 6) through respective vias to couple with the heating element.

As demonstrated in the example FIG. 5, the heating element 502 may be implemented as one or more windings of a rectangular spiral shape that are distributed fairly evenly across the layer to which it is applied. In this way, a larger area of the bulk silicon (between the heating element 502 and temperature sensing element 512) may be heated in response to a signal applied to the resistant heating element 502 disposed thereon. Additionally, the resistive heating element 502 may be non-inductive to minimize frequency dependencies of the heating element, such that the sensor device of the MEM structure 500 can operate over broadband of input signals (e.g., from a DC to GHz or higher). The heating element 502 may be made non-inductive by patterning it in such a way the flux from one trace of the resistor cancels the flux from an adjacent trace. For example, by implementing the heating element 502 as an integrated resistor with pairs of conductive traces having opposing currents wrapped in a spiral, the flux can be cancelled and thus make the inductance very low (e.g., negligible).

Referring to FIG. 6, the heating of the central core region 506 of the MEM structure 500 is isolated with respect to the surrounding substrate because the central core region where the heating element 502 and temperature sensing element 512 reside is surrounded by a cavity 614 that includes a vacuum or an inert gas. For example, the cavity 614 includes void formed by etching. The cavity 614 also is formed by a standoff spacing between the cap 620 and the floating core structure as well as standoff distance between the bulk silicon base 604 and the floating core structure. As a result, the thermal loss above and below the heating element 502 is mostly radiation loss and is minimal due to the insulation of the surrounding vacuum or inert gas. For example, a dominant conductive path for loss of thermal energy is through the support arms 508 because the support arms support the central core region of the MEM structure 500 where the heating element 502 resides. By configuring the support arms 508 to extend along the perimeter of the central core region 506, such as shown in FIG. 5, the loss through the arms 508 along the perimeter portion is symmetrical. Thus, the dimensions of the arms 508 can be a design parameter that can be controlled, such as by setting the length and cross-sectional thickness of each of the respective arms. In addition to being used to control the thermal loss of the heating region, the support arms 508 also are configured to isolate the central core region from packaging stress that normally effects circuitry and structures within packaging materials.

As shown in FIG. 6, which is a cross-sectional view 600 of the MEM structure 500 of FIG. 5 taken along the lines 6-6, the resistive element 502 is built on top of (or within) one or more insulating layers of inter-metal dielectric. For example, the MEM structure 500 is formed on a silicon substrate (e.g., a wafer) that is joined to a bulk silicon base 604. In other examples, other bulk semiconductor materials may be utilized as a corresponding substrate for constructing the MEM structures disclosed herein. The central core region 506 is formed over the silicon base substrate 602. For example, the central core region 506 is spaced apart and insulated from the base layer 604 by the void that surrounds the core region.

In the example of FIG. 6, the temperature sensing element 512 is formed in the bulk silicon material. For example, the temperature sensing element 512 is a diode formed by doping the corresponding portion of the bulk silicon 602 (e.g., to create a corresponding P-N junction. The anode and cathode of the diode 512 can be coupled to respective output terminals (not shown, but see, e.g., 118 and 128) through respective interconnects. As mentioned, a current source can be coupled to the anode to bias the diode and the voltage across the diode can vary in response to heating of the central core region 506 (by current flowing through heating element 502). The insulating layer 608 is formed over the bulk silicon base layer 602 and the corresponding portion of the core region 506. For example, the insulating layer is an oxide layer that may be grown or deposited (e.g., by thermal oxidation or vapor deposition) on the bulk silicon through an appropriate fabrication process. As an example, the insulating layer 608 is formed of an inter-metal dielectric (e.g., oxide layer) that provides galvanic isolation between the input and output of thermal converter circuit. The thickness of the dielectric layer 608 can be increased or otherwise controlled to control the voltage breakdown between the heating element 502 and sensing element 512 in the bulk silicon 602. The heating element 502 is formed in or over the insulating layer 608, such as described herein. For example, if a lower voltage breakdown may suffice, the resistive heating element may be formed in the silicon base layer (e.g., a diffused resistor). It this example, the resistive heating element is electrically separate from the temperature sensing element by junction isolation.

As shown in FIG. 6, a passivation layer 612 is formed over the insulating layer 608 and the heating element 502, which defines a surface (e.g., shown as a top surface) of the central core region 506. For example, the passivation layer 612 is formed of a glass (e.g., a silicate or borophosphosilicate glass film) or other insulating material, such as a nitride or silicon dioxide, which is grown or deposited (e.g., by chemical vapor deposition) over the insulating layer 608 and heater 502. As mentioned, interconnects 510 (e.g., corresponding to the interconnect 510) may be formed on the arms and extend through vias formed in the passivation layer to couple to the heating and temperature sensing elements. For example, a pair of interconnects can be coupled to ends of each respective heating element and to respective ends of each temperature sensing element.

During formation of the MEM structure 500, the substrate region surrounding the core region 506 is removed, such as by etching (e.g., chemical etching, plasma etching or the like), so that the central core region is floating in the cavity 614. A cap layer 620 of a substrate material (e.g., another bulk silicon wafer) is applied to enclose the floating central core region 506 between the base layer 604 and the cap layer. For example, the cap layer 620 is applied to hermetically seal and form an enclosure around the floating central core region 506 in the MEM structure 500 and the surrounding cavity 614. That is, the support arms 508 support the central core region 506 within the cavity 614 that contains a vacuum or inert gas surrounding the central core region 506.

Even though the thermal conductance of the insulating layer 608 (e.g., an oxide layer) may be substantially less (e.g., about 10 times less) than silicon, because the core region 506 is enclosed within a vacuum or inert gas and has minimal thermal loss out of the support arms, the oxide layer affords a high dielectric voltage standoff while also achieving high sensor gain relative to the heated region temperature rise versus the input signal level. That is, the thermal converter formed by the resistive heating element 502 and the temperature sensing element 512 in the bulk silicon provides a high level of sensitivity to the input signal. The insulating layer 608 between the heating element 502 and the temperature sensing element 512 provides galvanic isolation between the input and the output of the thermal converter circuit. Additionally, the mass of the central core region 506 provides for averaging or the "mean" portion of the RMS calculation that is implemented by the thermal converter. This enables the thermal converter to achieve a desired low cutoff frequency for the thermal low pass filter. For example, the thermal converter has a transfer function that is root-square at DC and low frequency and, as frequency increases, the thermal mass and thermal resistance of the assembly averages (e.g., provides the mean). The thermal resistance between the heating element and the diode and the thermal mass of the core region thus provide design parameters that can be configured to adjust the cutoff frequency of the thermal converter. As a result, the thermal converter can operate to a DC input level where the transfer function of the circuit is linear and rectifying. In practice, frequencies in the MHz and GHz are filtered by the thermal converter on the MEM structure and lower frequencies may be filtered adequately in post processing.

Figure 7:
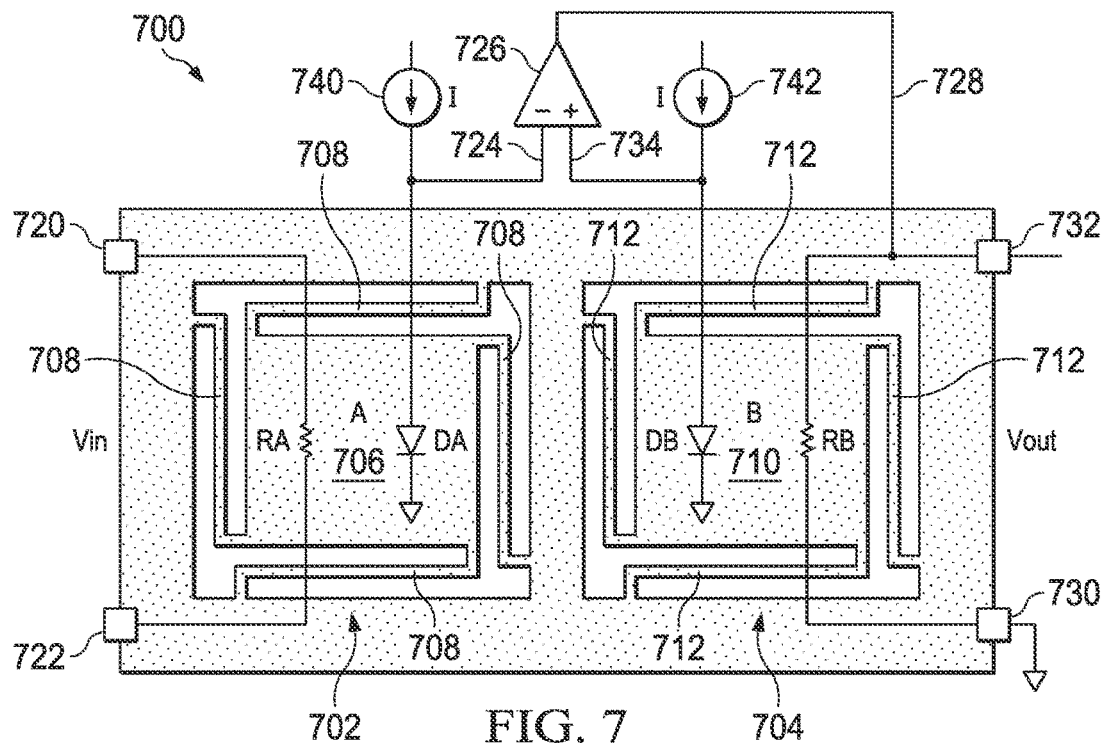
FIG. 7 depicts an example of a sensor device that includes MEM thermal converters coupled in a closed loop circuit topology.

FIG. 7 depicts an example of a sensor device 700. The sensor device 700 includes a pair of MEM structures 702 and 704. Each of the MEM structures 702 and 704 may be implemented according to any of the examples disclosed herein (e.g., FIG. 1, 5 or 6). In the example of FIG. 7, the device 700 includes a pair of MEM structures, although the sensor device 700 may be constructed to have different numbers of MEM structures, such as according to the examples FIGS. 3 and 4. Each of the MEM structures 702 and 704 includes a resistive heating element demonstrated schematically as RA and RB, respectively. Each MEM structure 702 and 704 also includes a respective temperature sensing element demonstrated as diodes DA and DB, respectively. The heating element RA and sensing element DA of MEM structure 702 are implemented on a central core region 706 of the MEM structure. The central core region 706 is supported by an arrangement of arms 708 connected between the core and the surrounding substrate. For example, the support arms 708 configured to support the central core region 706 to be floating in a cavity (e.g., containing a vacuum or an inert gas) within the surrounding substrate. In the example of FIG. 7 the support arms extend along each side portion of the central core region 706 in a symmetrical manner. The support arms 708 and cavity thus cooperate to provide thermal and mechanical isolation between the core region 706 and the surrounding substrate material. The second MEM structure 704 may be configured as an identical or proportional replica of the MEM structure 702. Briefly, the MEM structure 704 includes a corresponding central core region 710 that is supported by an arrangement of support arms 712.

The resistive heating element RA of MEM structure 702 is coupled to input terminals 720 and 722, such as through corresponding interconnects that are coupled to ends of the resistive heating element formed in the central core region 706. Thus in response to applying an input signal VIN to the input terminals 720 and 722, the electric current through the heating element causes a rise in temperature that is transferred through dielectric insulation to the bulk silicon of the central core region. The rise in temperature, however, is thermally insulated from the surrounding substrate and circuitry through the vacuum or inert gas that is contained in the surrounding region.

The heating of the central core region 706 induces a forward voltage drop change in the diode DA which is coupled to an input 724 of an amplifier 726. A current source also may be coupled to bias the diode DA through a corresponding interconnect coupled to the anode thereof, as schematically shown. Another end of the diode DA may be coupled to electrical ground through another interconnect. The voltage across the diode DA varies as a function of the heating of the central core region 706 and thus represents an RMS value of the input signal VIN. The voltage across the diode is provided as an output signal to the input terminal 724 of the amplifier 726.

In the example of FIG. 7, an output 728 of the amplifier 726 is coupled to a node (terminal 732) of the resistive heating element RB and another node of the heating element is coupled to electrical ground through a terminal 730. The output 728 of the amplifier 726 thus is configured to drive current through the resistive heating element RB based on the sensed temperature of the central core region 706 as provided by sensing element DA and based on temperature detected by sensing element DB for the central core region 710. For example, the anode of the diode DB is coupled to the non-inverting input 734 of the amplifier 726. A current source is also coupled to the diode DB to bias the diode, such the voltage across the diode DB due to heating of the central core region 710 through diode represents the heating of the central core region 710.

In this closed loop configuration, the amplifier 726 provides a feedback for driving the resistive heating element RB. As mentioned, the electrical characteristics of the central core region 706 and 710 can be identical as well as the thermal characteristics of the respective regions. When the servo implemented by the amplifier 726 is balanced and the temperature of the two core regions 706 and 710 are equivalent, the output signal $V_{OUT}$ across terminals 730 and 732 is equal to the equivalent heating value or the RMS value of the input signal $V_{IN}$ that is applied to terminal 720 and 722. Due to the matching and closed loop nature of the sensor device 700, the transfer function is linear and has wide bandwidth. Additionally because the area to be heated by each of the respective resistive heating elements RA and RB is relatively small (e.g., on the order of tens of micrometers or larger depending on application), the sensing device has high sensitivity. As a further example, at low frequencies or DC inputs, the output signal $V_{OUT}$ will directly follow an absolute magnitude of the input signal $V_{IN}$ until a corner frequency of the thermal LPF is reached. The corner frequency can be set based on the mass of the heated region and the thermal conductivity to that region. Additionally, at high frequencies (e.g., greater than the crossover frequency), the output signal $V_{OUT}$ provides an RMS or mean value of the input signal VIN. In some examples, the crossover frequency may be a design parameter that may be adjusted based on the size (mass) of the central core region 706, 710.

Figure 8:
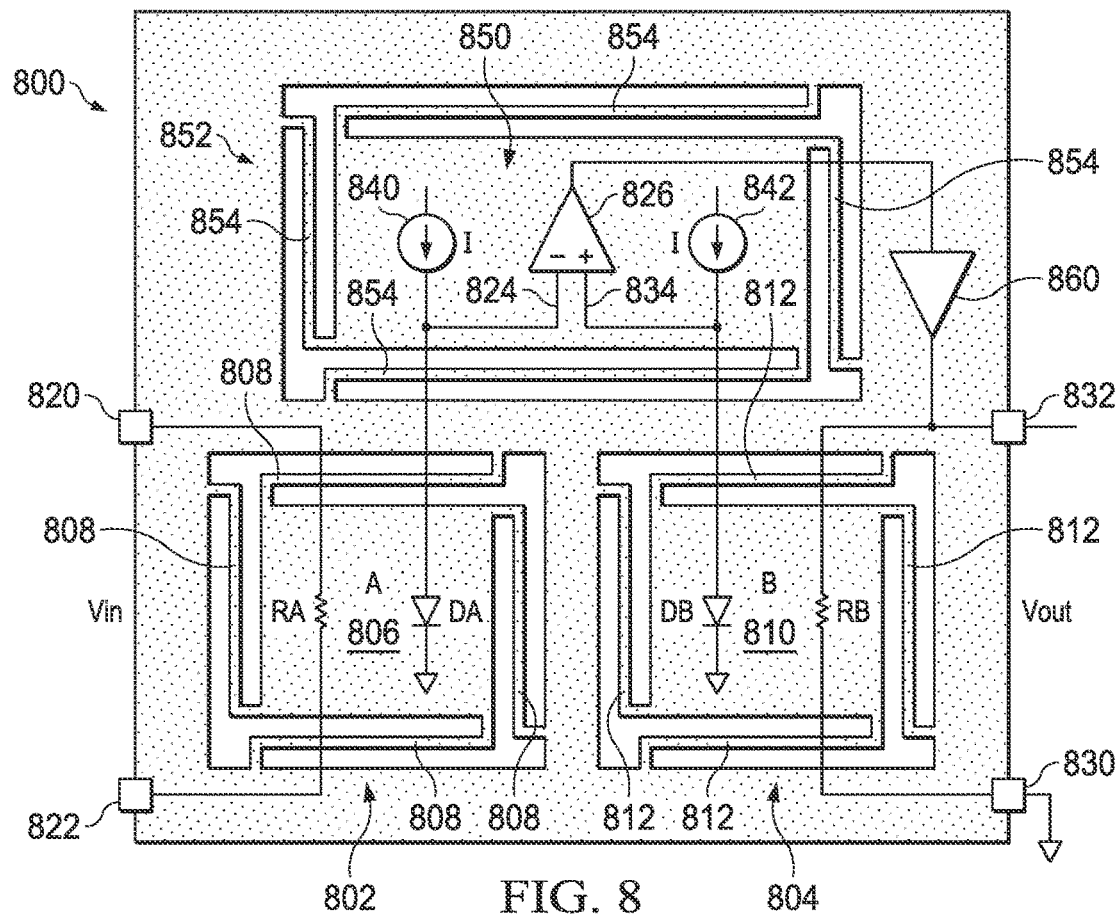
FIG. 8 depicts another example of a sensor device that includes MEM thermal converters in a closed loop circuit topology and output circuitry implemented on a MEM structure.

FIG. 8 depicts an example of another sensor device 800 that is configured as a closed loop sensor similar to the sensor 700 of FIG. 7. The sensor device 800 includes MEM structures 802 and 804 that may be implemented as described with respect MEM structures 702 and 704 of FIG. 7. Accordingly, references numbers used for features in the sensor device 800 of FIG. 8 are the same as those used to refer to the same features in FIG. 7 but are increased by adding one hundred. Thus, briefly stated, the MEM structure 802 thus includes a central core 806 that is supported by arms 808 and the central core region includes heating element RA and temperature sensing element DA. Similarly, a MEM region 804 includes a central core region 810 that is supported by arms 812 and terminals 830 and 832 are coupled to end nodes of resistive heating element RB. The temperature sensing element DA is coupled between input 824 of the amplifier 826 and electrical ground. Similar, the input of temperature sensing element DB is coupled to another input 834 of the amplifier 826 and electrical ground. Current sources 840 and 842 supply current to bias diodes DA and DB, respectively. The device 800 also includes inputs 820 and 822 and outputs 830 and 832.

In the example of FIG. 8, the amplifier 826 and associated current source circuits 840 and 842 are implemented on a central core region 850 of another MEM structure 852. The MEM structure 852 also includes support arms 854 that support the central core region 850 relative to the surrounding substrate of the structure. In this way the circuitry 826, 840 and 842 is mechanically and thermally isolated within the MEM structure and thus are not subjected to package stress. In the example of FIG. 8, the output of the amplifier 826 is coupled to drive the heating element RB through a corresponding buffer 860. In this example, the buffer 860 is formed in the substrate outside of the central core region 850. In other examples, the buffer 860 could also be implemented in the central core region 850 or within its own central core of another MEM structure (not shown) or in a circuit external to the device 800.

The examples of FIGS. 7 and 8 demonstrate that the various circuitry utilized to implement a sensing device, as disclosed herein, may be integrated within one or more MEM structures or, alternatively, certain circuitry (e.g., thermal converter circuitry) may be implemented in MEM structures while other circuitry may be external to any MEM structures and be coupled to the MEM structures through corresponding interconnects within a given sensor package. For example, components and circuitry (e.g., thermal converter circuitry) that may be stress-sensitive can be isolated in their own central core region of respective MEM structures while other circuitry resides external to such MEM structure(s).

Figure 9:
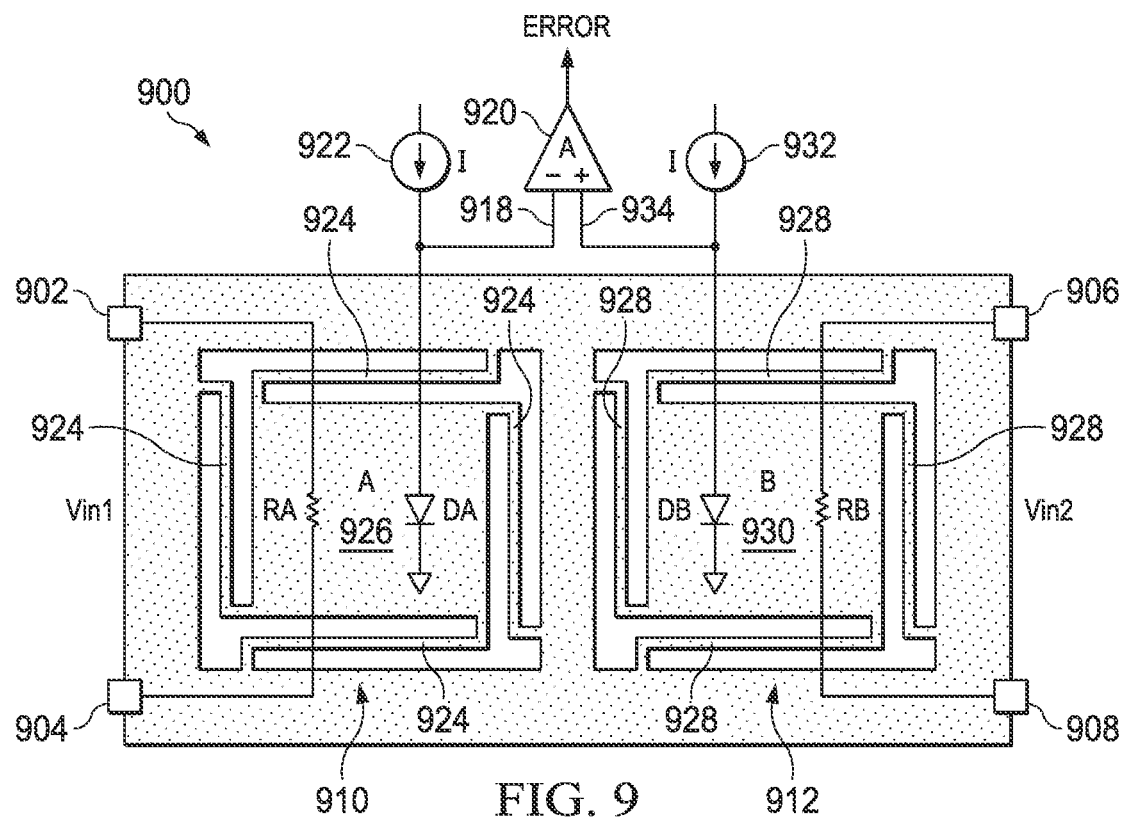
FIG. 9 depicts an example of a sensor device that includes MEM thermal converters in an open loop circuit topology.

FIG. 9 depicts an example of another sensor device 900. The sensor device 900 is implemented in an open loop configuration and configured to provide an ERROR signal based on input signals VIN1 and VIN2. The sensor device 900 includes input terminals 902 and 904 to receive the input signal VIN1 and another set of input terminals 906 and 908 adapted to receive the signal VIN2. The input signals can be from one or more associated circuit for which the sensing and generating of the ERROR signal is desired. The sensor device 900 also includes a pair of MEM structures 910 and 912, such as may be implemented as any MEM structures disclosed herein (e.g., 102, 104, 202, 204 500).

The sensor device 900 is configured to provide the ERROR signal based on a difference in the RMS value of the respective input signals VIN1 and VIN2. For example, the MEM structure 910 includes a thermal converter formed by a resistive heating element RA that is coupled between input terminals 902 and 904. The temperature sensing element DA is coupled between an input 918 of an amplifier 920 and electrical ground. A current source 922 is coupled to bias the diode DA, such that changes in temperature are reflected in the voltage across the diode DA at the input 918. The MEM structure 910 may be configured according to any of the examples disclosed herein, and thus includes a supporting structure, such as support arms 924 configured to support a perimeter portion of a central core region 926 within a cavity that may include a vacuum or inert gas. In this way, the signal provided at the input 918 of the amplifier 920 represents an RMS value of the input signal VIN1. Similarly, the MEM structure 912 includes a support arms 928 configured to support a perimeter portion of a central core region 930 within a cavity that contains a vacuum or inert gas. The output of the temperature sensing element DB thus provides a corresponding RMS value of the input VIN2 at the input 934 of amplifier 920. In this way, the amplifier 920 produces the ERROR signal to indicate a difference in the RMS values of the different inputs VIN1 and VIN2. The error signal may be used in other systems such as for balancing signals VIN1 and VIN2, fault detection or the like.

Figure 10:
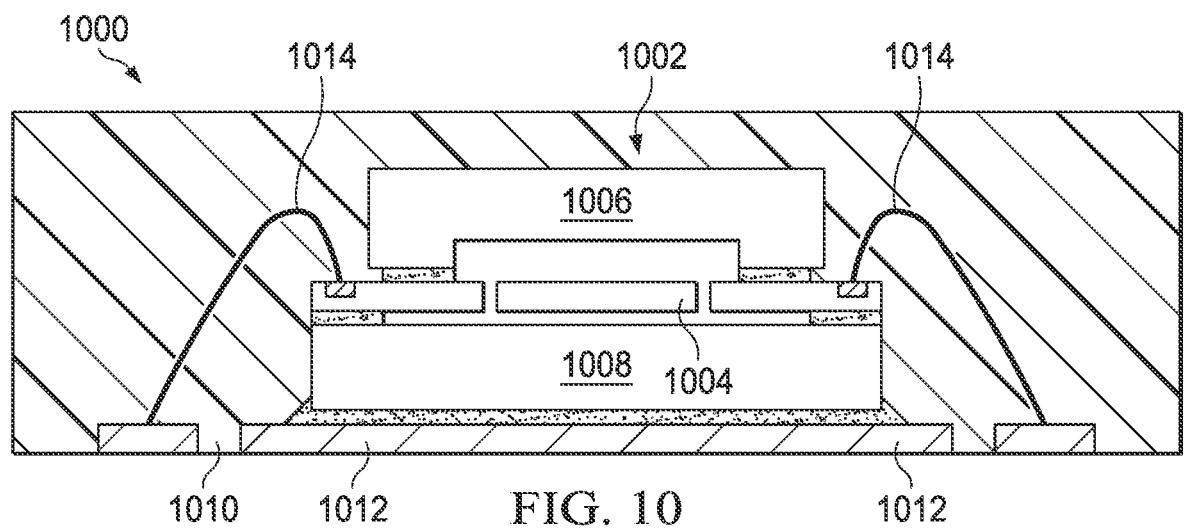
FIG. 10 depicts an example of an integrated sensor package.

FIG. 10 depicts an example of a sensor circuit package 1000. The package 1000 includes a sensor device that includes two or more MEM structures 1002, such as according to any of the examples disclosed herein (e.g., FIGS. 1, 2, 5 and 6). Each MEM structure 1002 may be implemented on a respective die or a multiple MEM structures may be implemented on a given die. For example, each such MEM structure 1002 includes a central core region 1004 that includes a thermal converter circuit formed of a heating element and a sensing element, such as disclosed herein. The central core region 1004 thus may be implemented as a multi-layer structure in which the heating element is spaced from the sensing element by one or more insulating layers. The central core region 1004 is supported within the MEM structure to be floating, such as being surrounded by a cavity that includes a vacuum or contains an inert gas. Thus, the central core region 1004 is thermally and mechanically isolated from the surrounding substrate material.

As shown in the example of FIG. 10, a cap layer 1006 is disposed over a layer to enclose and hermetically seal the MEM structure 1004 between the cap layer 1006 and a bulk substrate base layer 1008. As disclosed herein, the central core region 1004 is supported in the cavity with respect to the surrounding substrate through a support structure, such as a symmetrical arrangement of support arms coupled between the surrounding substrate and a given insulating layer of the central core.

The circuitry implemented within the central core region 1004 may be coupled to the surrounding substrate through an arrangement of interconnects (e.g., interconnects 510). Each of the respective interconnects thus may extend through one or more layers and couple to appropriate ends of the circuit components, such as disclosed herein (see, e.g., FIG. 5). In the example of FIG. 10, the MEM structure 1002 is encapsulated within a packaging material 1010, such as plastic (e.g., a thermosetting polymer or thermoplastic material) or an epoxy molding material. The substrate base layer 1008 is also disposed or attached to a corresponding lead frame 1012. A number of leads 1014 may be coupled between the MEM structure 1004 and the lead frame 1012. The leads thus provide electrical connections between the circuit components implemented on the central core region 1004 and input terminals (e.g., pins, pads or the like) that may be accessed by a circuitry external to the package 1000.

Because each of the MEM structures 1002 is sealed in a hermetic enclosure and floating with respect to the surrounding substrate material, the circuitry implemented on the central core region is afforded isolation from mechanical package stress and temperature variations. Additionally, the die or a number of die can be packaged in a respective single or multi-chip module that can be packaged according to standard, low-cost injection molded plastic packaging technologies. This enables the circuitry implemented on the central core region 1004 to maintain thermal isolation and accurate circuit performance that is independent of mechanical stress in the plastic packaging, customer printed circuit board to which the package is mounted, and other induced environmental conditions (e.g., humidity variations).

By way of further example, FIGS. 11-16 illustrate examples of different circuits that may be configured to implement sensor devices utilizing two or more MEM structures as disclosed herein. That is, each of the examples of FIGS. 11-16 includes a sensor device package 1102 that includes two or more MEM structures (e.g., single or multi-chip modules) 1104 and 1105 having sensor circuitry coupled to external circuitry to implement various sensing circuits. The sensor circuit package 1102 includes input terminals 1106 and 1108 coupled to receive an input signal VIN and electrical ground, respectively. In these examples, the sensor circuit package 1102 also includes output terminals 1110 and 1112; however, in other examples (e.g., an open loop sensor configuration—see, e.g., FIG. 17), the terminals 1110 and 1112 could be input terminals. For example, the sensor circuit package 1102 may be implemented according to the examples of FIG. 7 or 8 and thus include two or MEM structures (e.g., structure 500 of FIGS. 5 and 6) 1104 and 1105. As disclosed herein, the MEM structures 1104 and 1105 are configured to implement a thermal converter that provides an output signal at 1110 representing a true RMS value of the input signal VIN. While the external circuitry in the examples of FIGS. 11-16 are demonstrated as external to the package, in other examples, such circuitry also may be implemented within the package, in part or wholly. For example, such external circuitry may be implemented on a corresponding central core region of a MEM structure (e.g., similar to MEM structure 852 that includes amplifier circuitry in FIG. 8) or external to MEM structures. In each of the examples of FIGS. 11-16, the output terminal 1110 is galvanically isolated from the terminals 1106 and 1108. For purposes of consistency, in the following descriptions of FIGS. 11-16, identical reference characters are used to refer the sensor package 1102 and its components. Accordingly, reference may be made to the above description and other examples disclosed herein for information about the sensor package 1102.

Figure 11:
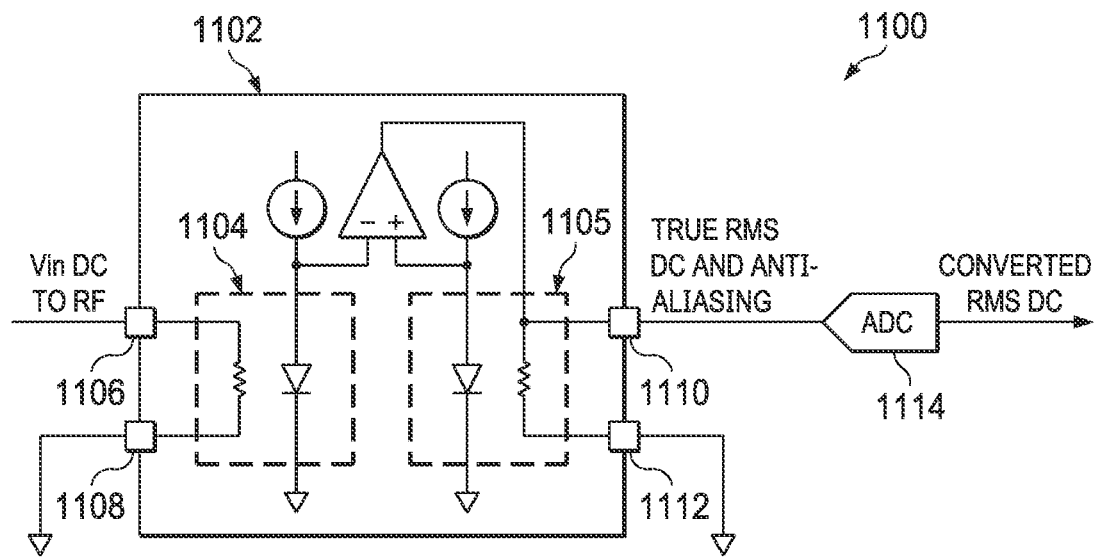
FIG. 11 depicts an example of a sensor device implementing the RMS converter.

FIG. 11 depicts an example of a true RMS converter circuit 1100. The circuit 1100 includes the sensor circuit package 1102, as disclosed herein, that is coupled to an analog-to-digital converter (ADC) 1114. The output terminals 1110 and 1112 of the sensor package 1102 are coupled to an input of the ADC 1114 and ground, respectively. The ADC thus is configured to convert the analog DC signal provided at 1110 to a corresponding digital representation of the RMS value.

Figure 12:
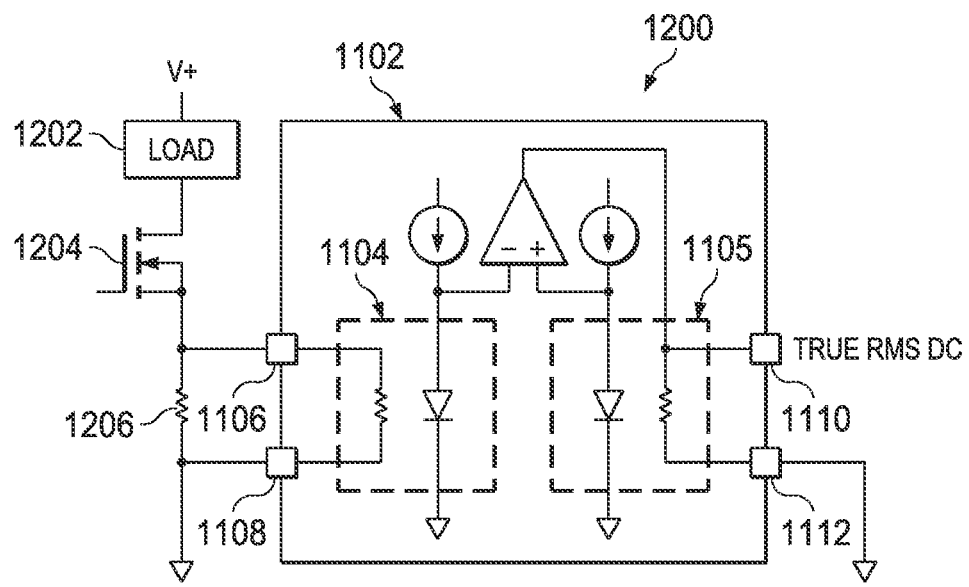
FIG. 12 depicts an example of a low-side current sensor circuit.

FIG. 12 depicts an example of a low-side sensor circuit 1200. In the example of FIG. 12, a load 1202 is coupled between a voltage rail V+ and a switch device (e.g., a metal oxide semiconductor field effect transistor (MOSFET)) 1204. In this example, a current sense resistor 1206 is connected in series with the switch device 1204 and between terminals 1106 and 1108 in parallel to the heating resistor of the MEM structure 1104. For high current measurement applications, the value of the resistor 1206 may be several orders of magnitude lower than the heating resistor. An output of the switch device 1204 is coupled to input terminal 1106 and terminal 1108 is coupled to ground. The output terminal 1110 thus provides an output signal representing a true RMS DC value of the voltage across the current sense resistor 1206, which varies in response to activation of the switch device 1204. The ability to respond to the small voltage drop across this current sense resistor 1206 is enabled by the high sensitivity of the MEM structure 1104 and 1105 resulting from its small size and thermally insulated construction.

Figure 13:
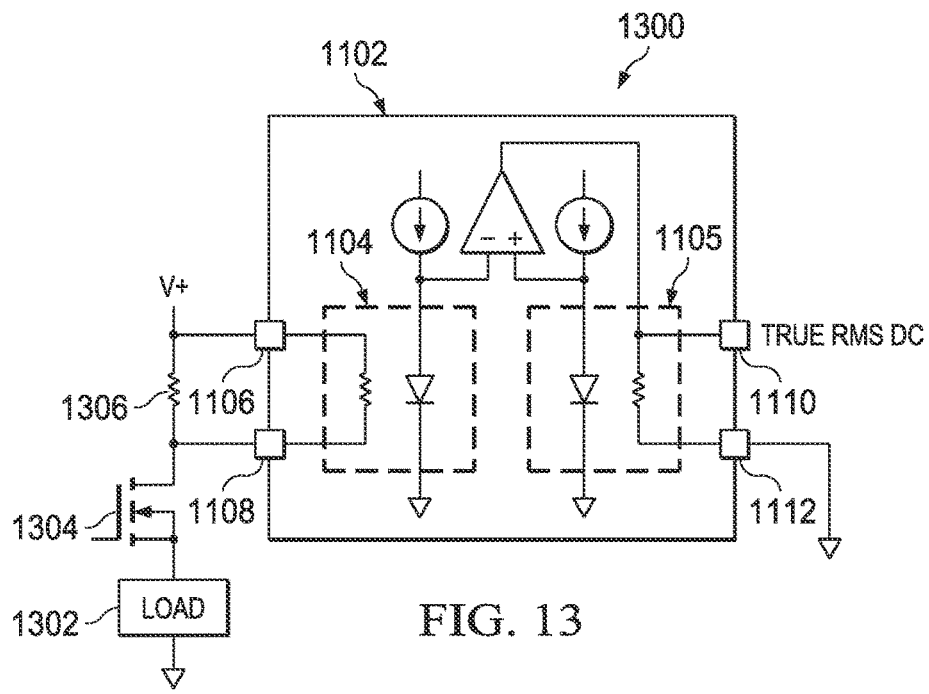
FIG. 13 depicts an example of a high-side current sensor circuit.

FIG. 13 depicts an example of a high-side sensor circuit 1300. In the example of FIG. 13, a voltage rail V+ is coupled to apply a respective voltage at terminal 1106. A switch device (e.g., MOSFET) 1304 is coupled in series with a grounded load 1302 to terminal 1108. In an example, a current sense resistor 1306 is connected in series with the switch device 1304 and between terminals 1106 and 1108 in parallel to the heating resistor of the MEM structure 1104. For high current measurement applications, the magnitude of the resistor 1306 may be several orders of magnitude lower than the heating resistor. In response to activation of the switch device 1304, current is applied to supply power to the load 1302. The output terminal 1110 thus provides an output signal representing a true RMS DC value of voltage across the resistor 1306, which varies in response to activation of the switch device 1304.

Figure 14:
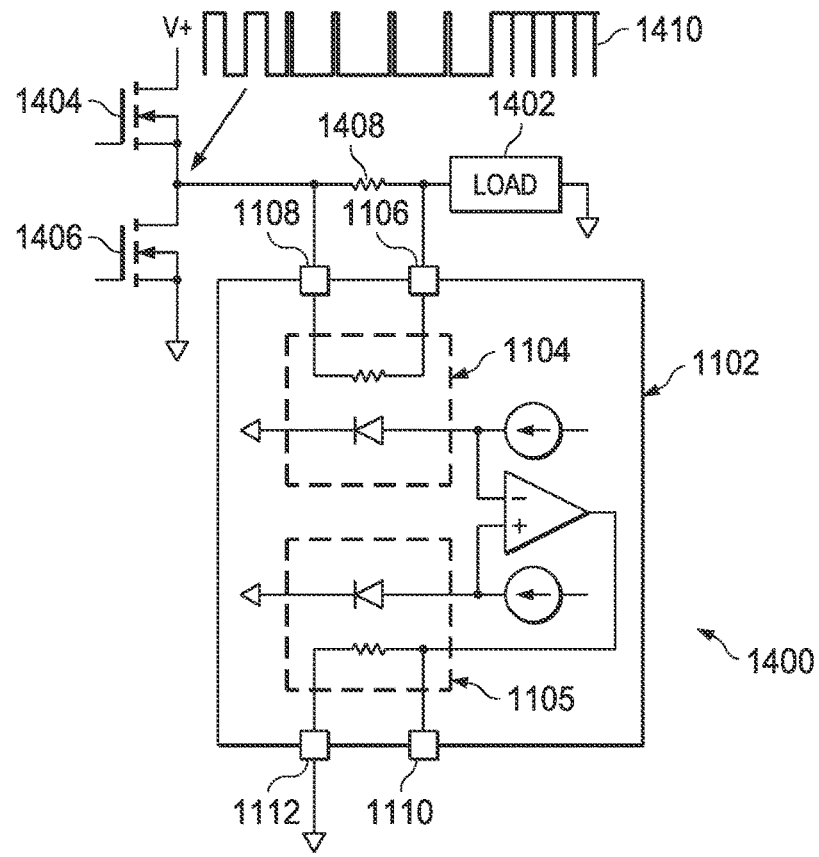
FIG. 14 depicts an example of another current sensor circuit.

FIG. 14 depicts an example of another sensor circuit 1400, such as for sensing current applied to a load 1402. In the example of FIG. 14, the load is coupled to terminal 1106 of the sensor device package 1102. The sensor device package 1102 is configured to sense the current in the load as represented as a voltage drop across current sense resistor 1408. A high-side switch device 1404 and a low-side switch device 1406 are connected between a voltage rail V+ and electrical ground. An intermediate node between the switch devices is coupled to the terminal 1108. In an example, a current sense resistor 1408 is connected between terminals 1106 and 1108 in parallel to the heating resistor of the MEM structure 1104. For high current measurement applications, the magnitude of the resistor 1408 may be several orders of magnitude lower than the heating resistor. In this way, the voltage applied to the load 1402 through the resistor 1408, such as a pulse width modulated signal 1410, is also provided to the heating element of MEM structure 1104, such that a corresponding RMS value of the voltage across the resistor 1408 is provided at the terminal 1110.

Figure 15:
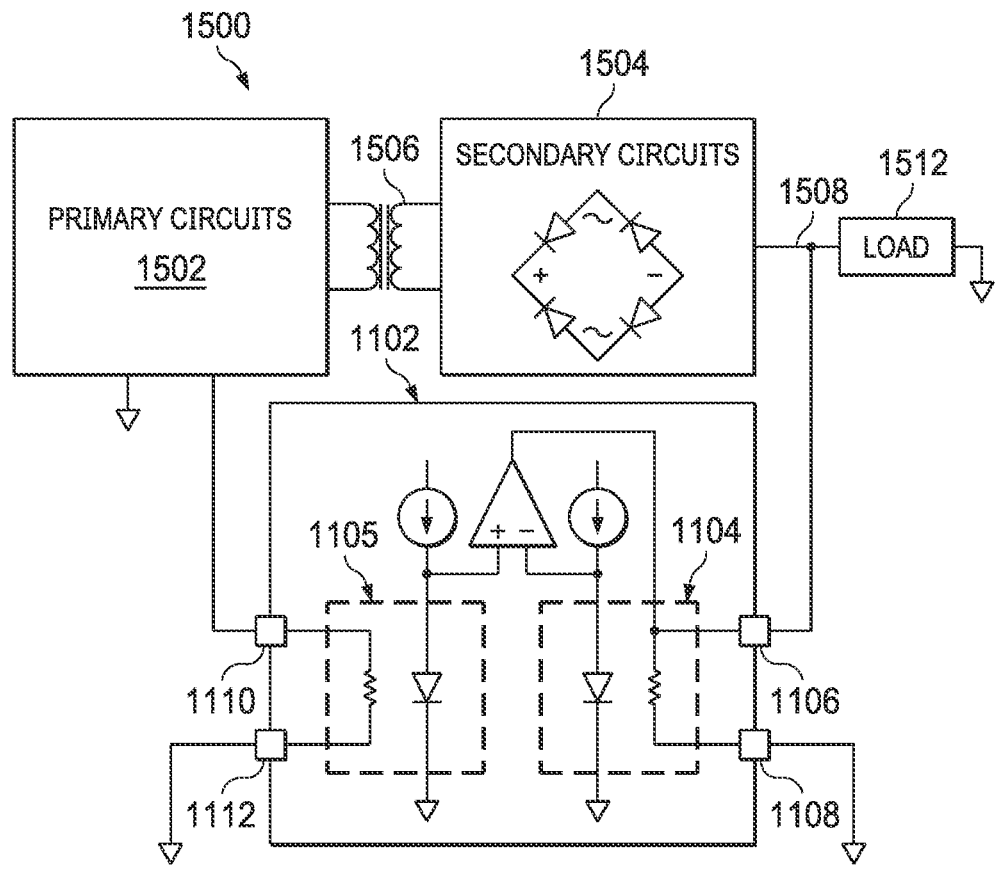
FIG. 15 depicts an example of a DC-DC converter that includes a sensor circuit to provide feedback.

FIG. 15 depicts an example of a DC-DC converter 1500 that includes a sensor device 1102 coupled in feedback path of the converter. For example, the converter 1500 includes primary circuits 1502 coupled to secondary circuits 1504 through a transformer 1506. The sensor device 1102 is coupled between an output 1508 of the converter and a feedback input 1510 of the converter. In the example of FIG. 15 the output 1508 of the converter 1500 is coupled to terminal 1106 and terminal 1108 is coupled to ground. The sensor device 1502 is configured to sense a voltage applied to a load 1512 by the converter 1500 and provide an RMS DC signal as feedback to the input 1510 representing the load voltage. The sensor device 1102 disclosed herein may be used for providing an RMS value of a feedback voltage for other types of converters.

Figure 16:
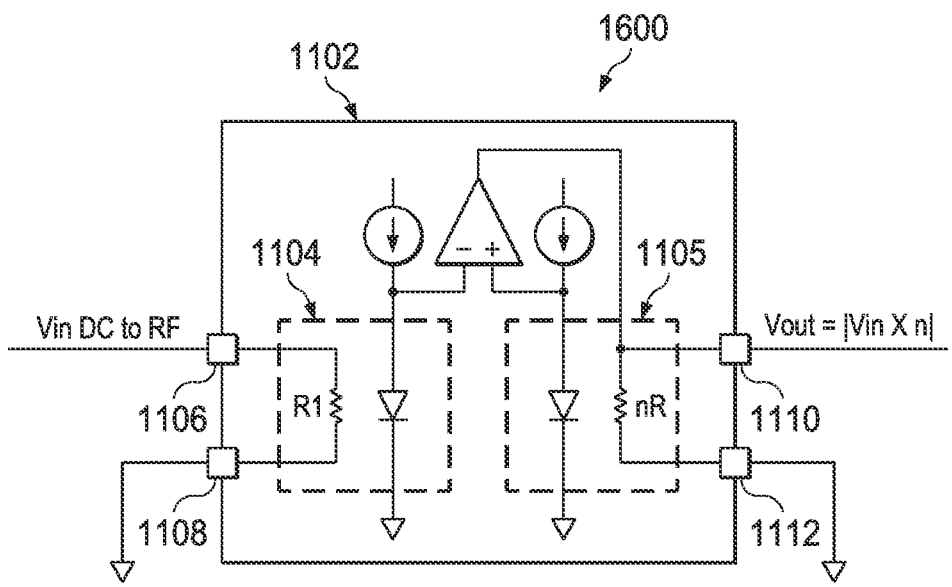
FIG. 16 depicts an example of an isolated operational amplifier.

FIG. 16 depicts an example of an isolated operational amplifier 1600 that includes a sensor device 1102. In the example of FIG. 16, the sensor device in which the resistive heating element of MEM structure 1104 has a resistance R and the heating element of MEM structure 1105 has an aggregate resistance of nR, where n is multiplier (fractional or integer) that sets a gain of the amplifier 1600. For example, the gain may be set (e.g., as a design parameter) by configuring an arrangement of the MEM structures 1105 in series or parallel to increase or decrease, respectively, the gain of the amplifier 1600 accordingly. An input voltage (e.g., ranging from a DC input to an RF input signal) is applied to terminal 1106. The operational amplifier 1600 provides an output signal VOUT at terminal 1110. For example, the output voltage at 1110 may be represented as VOUT=|VIN*n|. The operation amplifier 1600 of FIG. 16 may be used in any of the examples of FIGS. 11-15 to adjust the sensitivity of sensing based on a proportionality of the resistance value of respective heating elements.

Figure 17:
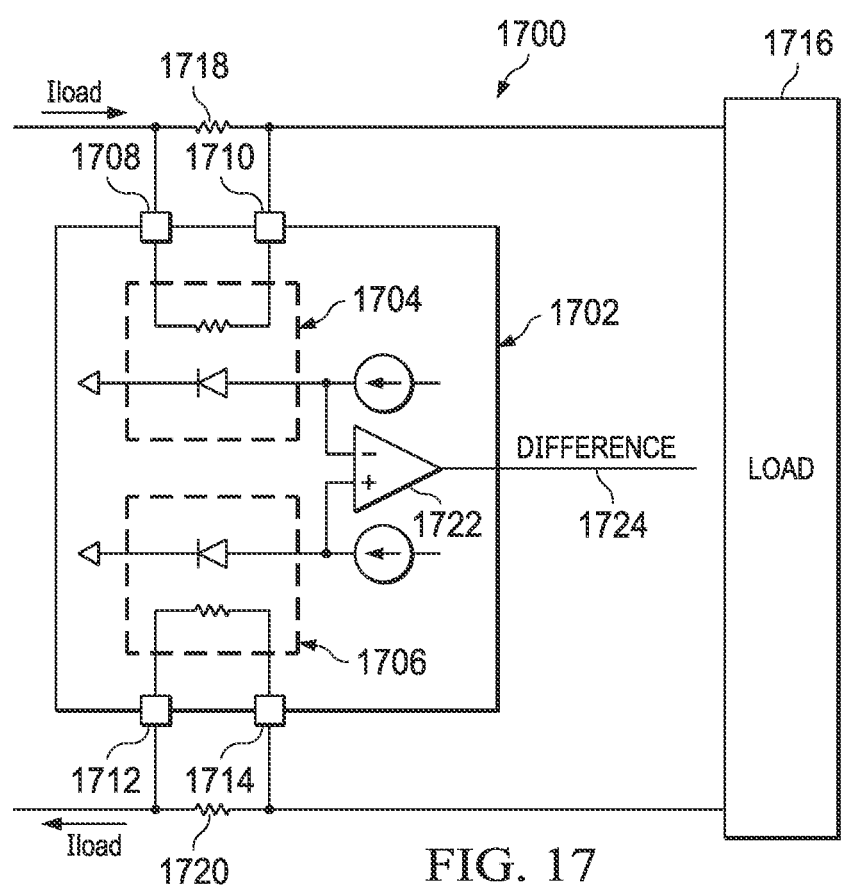
FIG. 17 depicts an example of a circuit to implement load balancing.

FIG. 17 depicts an example of a load sensing system 1700 that includes a sensor device 1702 in an open loop configuration (e.g., corresponding to sensor device 900 of FIG. 9). The open loop configuration of the sensor device 1702 may be used for ground fault detection, load balancing or other application. For example, the sensor device 1702 that includes two or more MEM structures 1704 and 1706, each having respective input terminals 1708-1710 am 1712-1714. In an example, a current sense resistor 1718 is connected between terminals 1708 and 1710 and another sense resistor 1720 is connected between terminals 1712 and 1714. For the example of high current measurement applications, the magnitude of the resistors 1718 and 1720 are several orders of magnitude lower than the heating resistor of respective MEM structures 1704 and 1706. The voltage across the resistor 1718 between terminals 1708-1710 is representative of input load current ILOAD applied to a load 1716, which is coupled between terminals 1710 and 1714. The voltage across the resistor 1720 between terminals 1712-1714 is representative of an output load current ILOAD from the load 1716. The sensor device 1702 includes circuitry (e.g., including an amplifier 1722) that is configured to provide an output signal at an output 1724 thereof representing a difference in the RMS value of the voltage signals applied to respective sets of input terminals 1708-1710 and 1712-1714.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A sensor circuit package comprising:
   at least two Micro-Electro-Mechanical (MEM) structures, each of the MEM structures comprising:
   a central core region including a thermal converter circuit that is configured to heat the central core region in response to a signal at an input thereof and to provide an temperature signal representing a temperature of a heated area of the central core region; and
   a support structure coupled between the central core region and a bulk substrate base layer, the support structure configured to support the central core region to be thermally and mechanically isolated with respect to the bulk substrate base layer; and
   an amplifier circuit configured to provide an amplifier signal at an output of the amplifier based on the output signals provided by the thermal converters of the respective MEM structures.

2. The sensor circuit package of claim 1, wherein:
   the at least two MEM structures comprise first and second MEM structures,
   the input of the thermal converter circuit of the first MEM structure is coupled to an input terminal of the package, and
   the output of the amplifier circuit is coupled to a heating element of the thermal converter circuit of the second MEM structure and to an output terminal of the package,
   wherein the output terminal is galvanically isolated from the input terminal.

3. The sensor circuit package of claim 2, wherein the amplifier is configured to drive current to the heating element of the thermal converter circuit of the second MEM structure based on a temperature sensed by a first temperature sensing element of the first MEM structure and a temperature sensed by a second temperature sensing element of the second MEM structure such that an output signal at the output terminal represents a root mean square value of an input signal applied at the input terminal.

4. The sensor circuit package of claim 3, wherein the first temperature sensing element and the second temperature sensing element each comprises one of a diode, thermistor, bipolar transistor, metal oxide semiconductor field effect transistor or thermocouple.

5. The sensor circuit package of claim 1, wherein:
the at least two MEM structures comprise first and second MEM structures,
the input of the thermal converter circuit of the first MEM structure is coupled to a first input terminal of the package,
the input of the thermal converter circuit of the second MEM structure is coupled to a second input terminal of the package, the first input terminal being isolated from the second input terminal, and
the amplifier is configured to provide an output signal at the output of the amplifier representing a difference in the root mean square value of signals applied at the first and second input terminals.

6. The sensor circuit package of claim 1, wherein the central core region of the each of the MEM structures is supported within a cavity by support arms, and the central core region of the each of the MEM structures further comprises:
a substrate layer that includes a temperature sensing element coupled to an input of the amplifier;
an insulating layer over the substrate layer;
a heating element over the insulating layer, the insulating layer configured to provide to provide galvanic isolation between the heating element and the temperature sensing element; and
a passivation layer disposed over the heating element.

7. The sensor circuit package of claim 6, wherein each of the MEM structures further comprises:
a cap layer disposed over the central core region to hermetically seal the central core regions and the cavity surrounding the respective central core regions within an enclosure between a base layer and the cap layer.

8. The sensor circuit package of claim 1, further comprising a lead frame, the lead frame comprising terminals coupled to the output of the amplifier and the input of at least one thermal converter.

9. A sensor circuit package comprising:
at least two Micro-Electro-Mechanical (MEM) structures, each of the MEM structures comprising:
a central core region including a thermal converter, the thermal converter having an input and an output; circuit
a support structure coupled between the central core region and a bulk substrate base layer,; and
an amplifier circuit configured to provide an amplifier signal at an output of the amplifier based on output signals provided by the thermal converters of the respective MEM structures.

10. The sensor circuit package of claim 9, wherein:
the at least two MEM structures comprise first and second MEM structures,
the input of the thermal converter circuit of the first MEM structure is coupled to an input terminal of the package, and
the output of the amplifier circuit is coupled to a heating element of the thermal converter circuit of the second MEM structure and to an output terminal of the package,
wherein the output terminal is galvanically isolated from the input terminal.

11. The sensor circuit package of claim 10, wherein the amplifier is configured to drive current to the heating element of the thermal converter circuit of the second MEM structure based on a temperature sensed by a first temperature sensing element of the first MEM structure and a temperature sensed by a second temperature sensing element of the second MEM structure such that an output signal at the output terminal represents a root mean square value of an input signal applied at the input terminal.

12. The sensor circuit package of claim 11, wherein the first temperature sensing element and the second temperature sensing element each comprise one of a diode, thermistor, bipolar transistor, metal oxide semiconductor field effect transistor or thermocouple.

13. The sensor circuit package of claim 9, wherein:
the at least two MEM structures comprise first and second MEM structures,
the input of the thermal converter circuit of the first MEM structure is coupled to a first input terminal of the package,
the input of the thermal converter circuit of the second MEM structure is coupled to a second input terminal of the package, the first input terminal being isolated from the second input terminal, and
the amplifier is configured to provide an output signal at the output of the amplifier representing a difference in the root mean square value of signals applied at the first and second input terminals.

14. The sensor circuit package of claim 9, wherein the central core region of the each of the MEM structures is supported within a cavity by support arms, and the central core region of the each of the MEM structures further comprises:
a substrate layer that includes a temperature sensing element coupled to an input of the amplifier;
an insulating layer over the substrate layer;
a heating element over the insulating layer, the insulating layer configured to provide to provide galvanic isolation between the heating element and the temperature sensing element; and
a passivation layer disposed over the heating element.

15. The sensor circuit package of claim 14, wherein each of the MEM structures further comprises:
a cap layer disposed over the central core region to hermetically seal the central core regions and the cavity surrounding the respective central core regions within an enclosure between a base layer and the cap layer.

16. The sensor circuit package of claim 9, further comprising a lead frame, the lead frame comprising terminals coupled to the output of the amplifier and the input of at least one thermal converter.

* * * * *